(12) United States Patent
Suzuki

(10) Patent No.: US 6,944,027 B2
(45) Date of Patent: Sep. 13, 2005

(54) SWITCHING POWER SUPPLY UNIT

(75) Inventor: Hitoshi Suzuki, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 72 days.

(21) Appl. No.: 10/483,195

(22) PCT Filed: Apr. 4, 2003

(86) PCT No.: PCT/JP03/04316

§ 371 (c)(1), (2), (4) Date: Jan. 8, 2004

(87) PCT Pub. No.: WO03/088464

PCT Pub. Date: Oct. 23, 2003

(65) Prior Publication Data

US 2004/0184293 A1 Sep. 23, 2004

(30) Foreign Application Priority Data

Apr. 18, 2002 (JP) .......................... 2002-116153
Mar. 3, 2003 (JP) .......................... 2003-055700

(51) Int. Cl.⁷ .............................. H05K 1/14; H05K 1/00
(52) U.S. Cl. ....................................... 361/736; 361/748
(58) Field of Search ................................ 363/144, 147; 361/601, 679, 731, 733, 734, 736, 738, 741, 748, 761, 763, 801, 809

(56) References Cited

U.S. PATENT DOCUMENTS 5,288,236 A * 2/1994 McIntyre ..................... 439/70
5,615,387 A * 3/1997 Crockett et al. ............... 29/847
6,496,385 B1 * 12/2002 Smithson et al. ............. 361/801
6,674,643 B2 * 1/2004 Centola et al. ............... 361/720

FOREIGN PATENT DOCUMENTS

| DE | 100 07 871 A1 | 1/2001 |
|---|---|---|
| JP | 1-82684 | 6/1989 |
| JP | 6-61621 | 3/1994 |
| JP | 6-43712 | 6/1994 |
| JP | 9-65661 | 3/1997 |
| JP | 2000-217348 | 8/2000 |
| JP | 2000-299614 | 10/2000 |
| JP | 2000-308340 | 11/2000 |
| JP | 2001-8440 | 1/2001 |
| JP | 2002-233163 | 8/2002 |

* cited by examiner

Primary Examiner—Matthew V. Nguyen
(74) Attorney, Agent, or Firm—Morgan & Finnegan, LLP

(57) ABSTRACT

Replaceable parts having a relatively short service life such as electrolytic capacitors are mounted on a reusable printed circuit board and one or more than one replaceable printed circuit boards so that the operation of replacing the electrolytic capacitors can be performed very easily and reliably. The replaceable printed circuit board may preferably be fitted to a replaceable frame and the replaceable frame is replaced. The primary side replaceable parts and the secondary side replaceable parts may be mounted on the same replaceable printed circuit board.

9 Claims, 4 Drawing Sheets

SWITCHING POWER SUPPLY UNIT

TECHNICAL FIELD

This invention relates to recycling of switching power supply units. More particularly, the present invention relates to replacement of parts of switching power supply units.

BACKGROUND ART

People have been increasingly paying attention to recycling of electronic parts in recent years because of environmental concerns. Particularly, recycling of printed circuit boards of electronic products such as personal computers and printers is a very serous problem to be dissolved.

Circuits that need recycling include power supply circuits. Power supply circuits normally contain electrolytic capacitors. Electrolytic capacitors have only a short service life if compared with other electronic parts. In addition, generally in a power supply circuit, electrolytic capacitors are arranged close to parts generating a large amount of heat and therefore, the service life of electrolytic capacitors can be further shortened by such heat. If there is something wrong with an electrolytic capacitor contained in an electronic product, it can seriously affect other electronic parts surrounding it. Therefore, electrolytic capacitors and other electronic parts having only a short service life are manually replaced and the other electronic parts are reutilized by following procedure that includes the steps listed below.
1. Visually confirm the electronic part to be replaced.
2. Remove the solder between the electronic part to be replaced and the printed substrate.
3. Remove the electronic part to be replaced from the printed substrate.
4. A replacement electronic part is inserted into the printed substrate.
5. Solder the replacement electronic part to the printed substrate.
6. Visually confirm the newly soldered replacement electronic part.

Meanwhile, Japanese Patent Application Laid-Open No. 6-61621 describes a technique of functionally separating a plurality of circuit sections on a single printed circuit board so that only the circuit section that has turned out to be defective can be replaced by a corresponding replacement circuit section that is commercially available. Japanese Patent Application Laid-Open No. 6-61621 also describes that detachable partitioning sections are arranged among the separated circuit sections and each of the circuit sections is provided with an interface.

However, the above described known technique of steps 1 through 6 for replacing an electronic part such as an electrolytic capacitor is accompanied by the following problems.

Tremendous time and efforts have to be spent in the steps for replacing an electronic part.

Since the soldering operation necessary for replacing an electronic part generates heat, means for protecting the operator has to be provided.

The heat generated by the soldering operation necessary for replacing an electronic part can peel off, if partly, the circuit pattern and/or reduce the reliability of the circuit pattern.

A wrong electronic part can be used as replacement at the time of replacing an electronic part.

The polarities of the replacement electronic part can be inverted at the time of replacing an electronic part.

In recent years, small packaged switching power supply units have been frequently used. The switching power supply unit is formed independently from the electronic product in which it is used and hence it is required to be replaced and reused in a simple and reliable way. More specifically, switching power supply units have to be so designed that the user can easily replace the switching power supply unit of his or her own electronic product.

With the technique described in the above cited Japanese Patent Application Laid-Open No. 6-61621, the frame of the electronic product needs to be opened and the printed substrate to be replaced has to be separated from-the printed circuit board in the inside. Subsequently, a replacement printed substrate needs to be connected and the frame has to be closed once again. Thus, the user may not feasibly use such a technique.

DISCLOSURE OF THE INVENTION

In view of the above identified circumstances, it is therefore an object of the present invention to provide a switching power supply unit that can be replaced and reused with ease by allowing any of its electronic parts including an electrolytic capacitor to be replaced in a simple and reliable way. Another object of the present invention is to provide a switching power supply unit the user can safely replace.

According to the invention, the above objects are achieved by providing a switching power supply unit comprising a reusable printed circuit board carrying reusable electronic parts and a replaceable printed circuit board carrying replaceable electronic parts and formed so as to be removably fitted to the reusable printed circuit board, the replaceable printed circuit board being electrically and mechanically connected to the reusable printed circuit board.

Preferably, in a switching power supply unit as defined above, said reusable printed circuit board is fitted to a main body frame and said replaceable printed circuit board is fitted to a replaceable frame in such a way that said mechanical connection is realized by way of said main body frame and said replaceable frame.

Preferably, in a switching power supply unit as defined above, said reusable printed circuit board and said replaceable printed circuit board are provided with respective connectors in such a way that said electronic connection is realized by way of said connectors.

Preferably, in a switching power supply unit as defined above, replaceable printed circuit boards are provided respectively at the primary side and at the secondary side of the unit.

Preferably, in a switching power supply unit as defined above, the replaceable electronic parts provided at the primary side and the replaceable electronic parts provided at the secondary side of the unit are mounted on the same replaceable printed circuit board.

Preferably, in a switching power supply unit as defined above, the replaceable electronic parts provided at the primary side and the replaceable electronic parts provided at the secondary side as mounted on the same replaceable printed circuit board are arranged with a predetermined gap interposed between them.

Alternatively, in a switching power supply unit as defined above, the replaceable electronic parts provided at the primary side and the replaceable electronic parts provided at the secondary side may be arranged along a lateral side of the switching power supply unit.

Preferably, in a switching power supply unit as defined above, said replaceable electronic parts include an electrolytic capacitor.

The above and other objects of the invention will become more apparent from the following description taken in conjunction with the accompanying drawings.

BEST MODE FOR CARRYING OUT THE INVENTION (First Embodiment)

Figure 1:
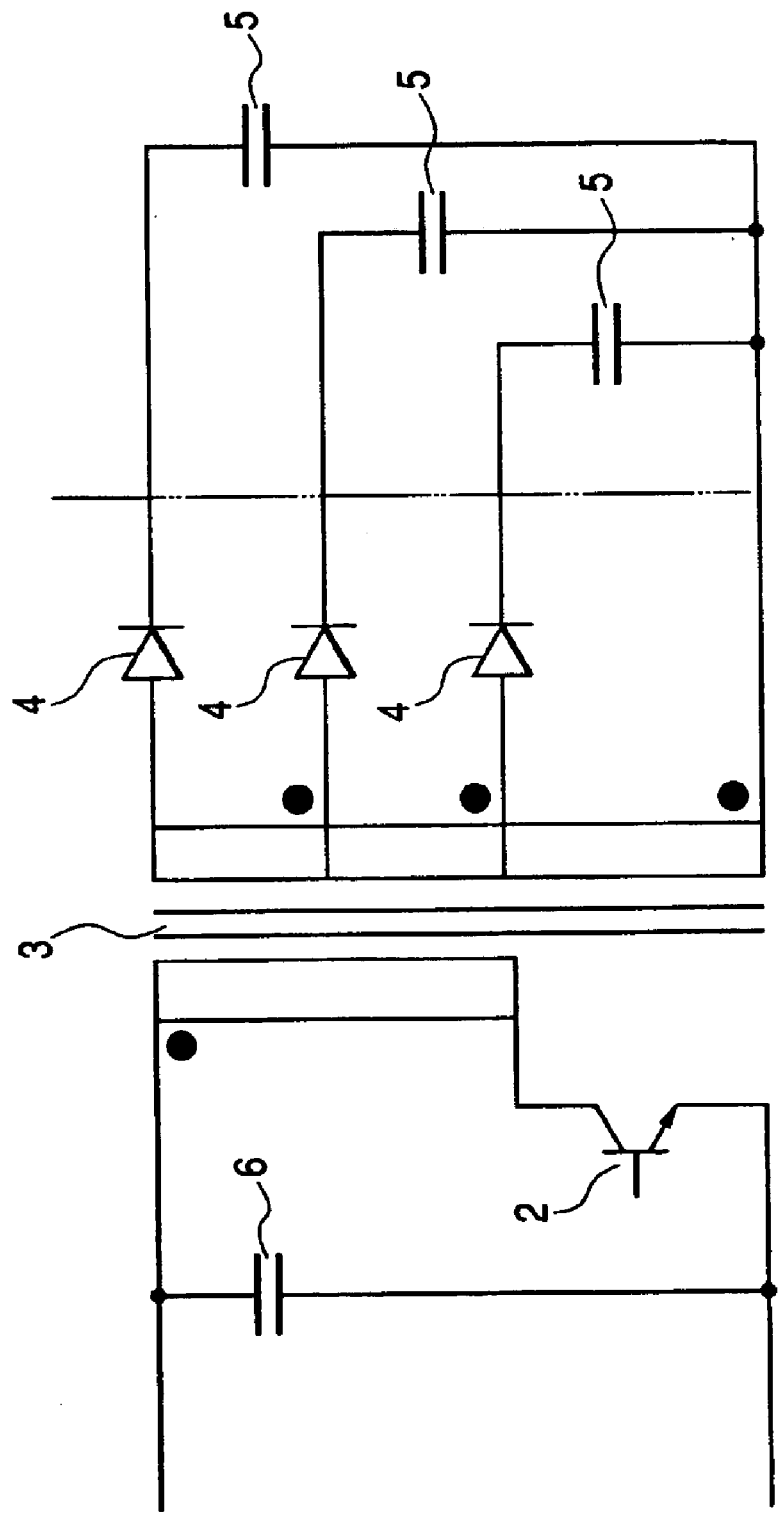
FIG. 1 is a schematic circuit diagram of the first embodiment of switching power supply unit according to the invention.
Figure 2:
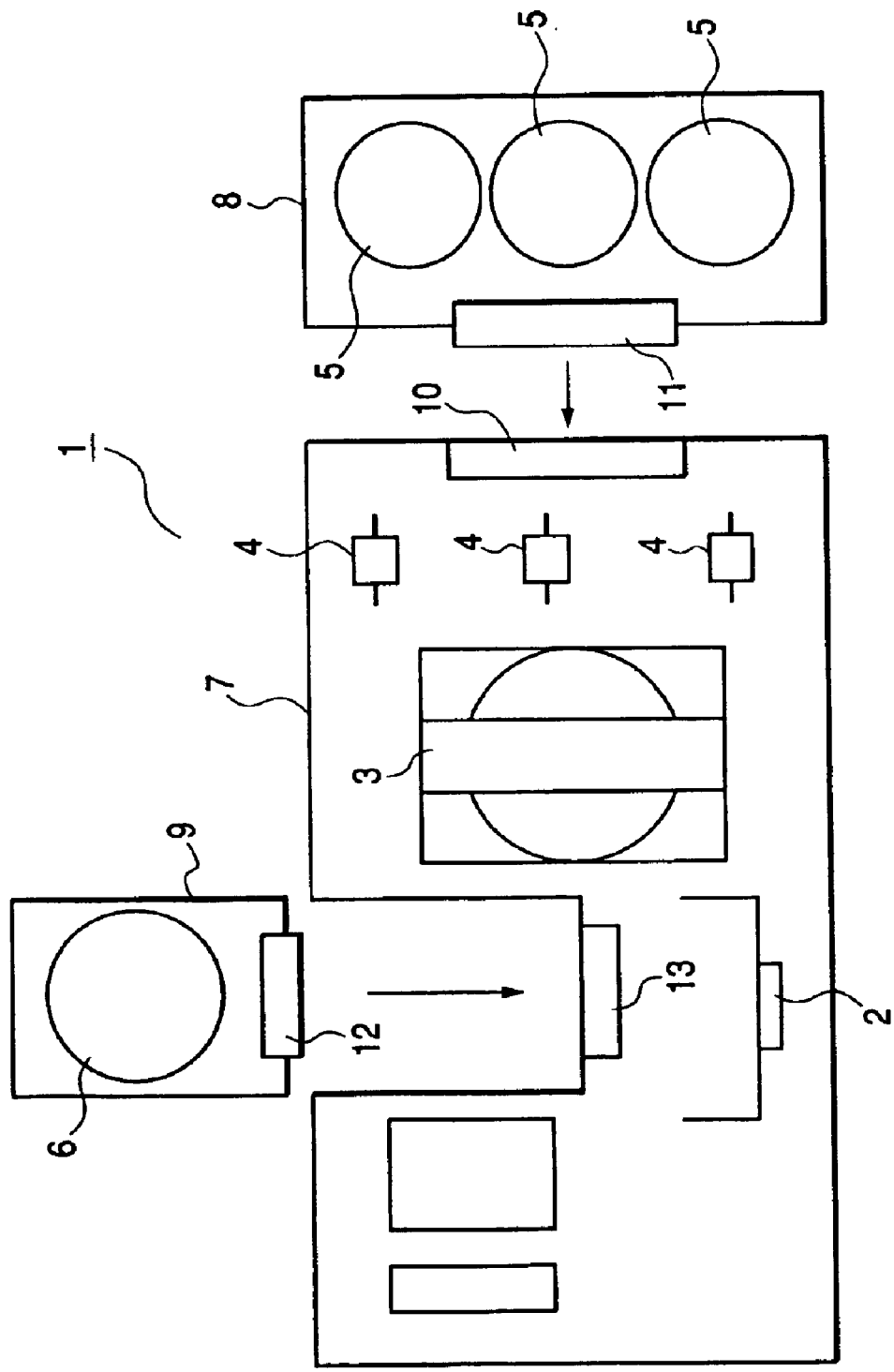
FIG. 2 is a schematic plan view of the power supply printed circuit board of the first embodiment.

FIG. 1 is a schematic circuit diagram of the first embodiment of switching power supply unit according to the invention and FIG. 2 is a schematic plan view of the power supply printed circuit board prepared by embodying the circuit of FIG. 1.

In FIGS. 1 and 2, reference symbol 1 generally denotes a power supply printed circuit board. Main electronic parts that are used for the power supply printed circuit board 1 include a switching element 2, a transformer 3, a rectifier diode 4 and electrolytic capacitors 5, 6. The power supply printed circuit board 1 comprises a reusable printed circuit board 7 that does not require replacement of any electronic part thereof because it is to be put to reuse. The reusable printed circuit board 7 carries a switching element 2, a transformer 3, a rectifier diode 4 and so on that have a long service life and are not liable to get out of order.

The power supply printed circuit board 1 also comprises a secondary side replaceable printed circuit board 8 carrying electrolytic capacitors 5 that have relatively short service life and are relatively liable to get out of order. A connector 10 is formed on the reusable printed circuit board 7, whereas a connector 11 is formed on the secondary side replaceable printed circuit board 8. The reusable printed circuit board 7 and the secondary side replaceable printed circuit board 8 come to be electrically connected to each other by connecting the connectors 10, 11. The connectors 10, 11 are removably fitted to the respective printed circuit boards 7, 8 so that the secondary side replaceable printed circuit board 8 can be easily moved away from the reusable printed circuit board 7.

Reference symbol 9 denotes a primary side replaceable printed circuit board carrying an electrolytic capacitor 6 that has relatively short service life and is relatively liable to get out of order. A connector 13 is formed on the reusable printed circuit board 7, whereas a connector 12 is formed on the primary side replaceable printed circuit board 9. The reusable printed circuit board 7 and the primary side replaceable printed circuit board 9 come to be electrically connected to each other by connecting the connectors 12, 13. The connectors 12, 13 are removably fitted to the respective printed circuit boards 7, 9 so that the primary side replaceable printed circuit board 9 can be easily moved away from the reusable printed circuit board 7.

When the electrolytic capacitors 5, 6 of the secondary side replaceable printed circuit board 8 and the primary side replaceable printed circuit board 9 respectively go out of service life and have to be replaced, firstly the connectors 10, 11 and the connectors 12, 13 are disconnected from each other and the secondary side replaceable printed circuit board 8 and the primary side replaceable printed circuit board 9 are moved away from the reusable printed circuit board 7. Then, a new secondary side replaceable printed circuit board 8 and a new primary side replaceable printed circuit board 9 that are prepared in advance are fitted to said reusable printed circuit board 7 by connecting the connectors 10, 11 and the connectors 12, 13 to each other.

Figure 3A:
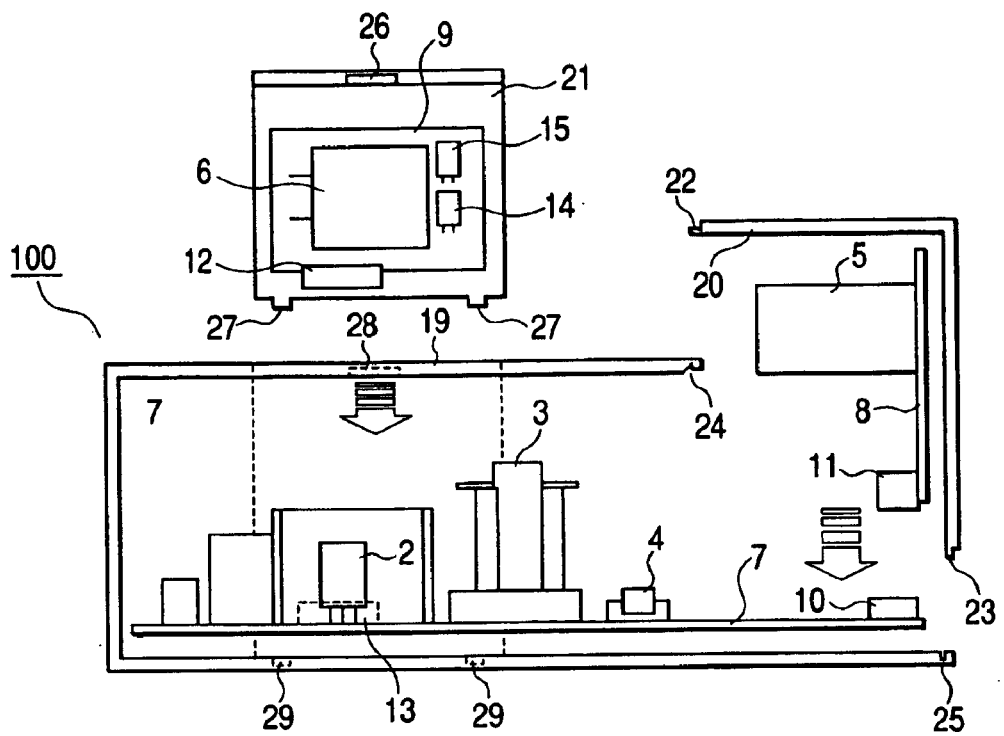
FIG. 3A is a schematic cross sectional view of the first embodiment of switching power supply unit according to the invention.
Figure 3B:
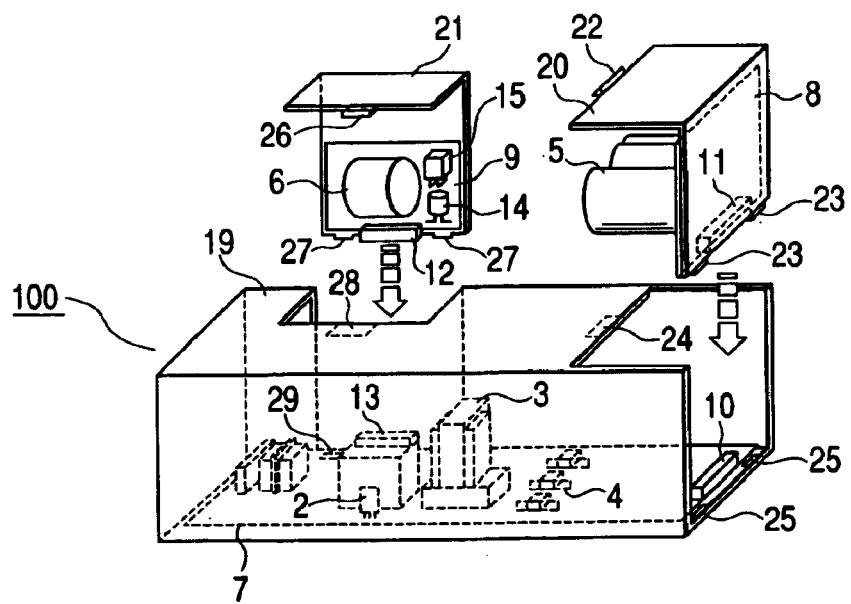
FIG. 3B is a schematic perspective view of the first embodiment of switching power supply unit according to the invention.

FIGS. 3A and 3B schematically illustrate the first embodiment of switching power supply unit realized by using the power supply printed circuit board 1 described above by referring to FIGS. 1 and 2. FIG. 3A is a schematic cross sectional view of the first embodiment of switching power supply unit 100 and FIG. 3B is a schematic perspective view of the first embodiment of switching power supply unit 100. Note that the replaceable parts are exploded in FIGS. 3A and 3B for the purpose of easy understanding. The inside of the switching power supply unit 100 is made partly visible. In FIGS. 3A and 3B, the components that are same as those of FIGS. 1 and 2 are denoted respectively by the same reference symbols and will not be described any further.

In the switching power supply unit 100, reference symbol 19 denotes a molded main body frame to be used for containing the switching power supply unit 100. The reusable printed circuit board 7 is mounted on the bottom of the main body frame 19. Reference symbol 20 denotes a molded secondary side replaceable frame to which the secondary side replaceable printed circuit board 8 that carries a plurality of electrolytic capacitors 5 is integrally fitted. Engaging projections 22, 23 are formed on the secondary side replaceable frame 20, whereas corresponding respective engaging recesses 24, 25 are formed on the main body frame 19. The secondary side replaceable printed circuit board 8 is arranged in such a way that the connector 11 of the secondary side replaceable printed circuit board 8 and the connector 10 of the reusable printed circuit board 7 are electrically reliably connected to each other when the engaging projections 22, 23 of the secondary side replaceable frame 20 and the corresponding respective engaging recesses 24, 25 of the main body frame 19 are brought into mutual mechanical engagement.

Reference symbol 21 denotes a molded primary side replaceable frame to which the primary side replaceable printed circuit board 9 carrying the electrolytic capacitor 6 is integrally fitted. In addition to the electrolytic capacitor 6, a photocoupler 14 having a service life substantially same as that of the electrolytic capacitor 6 and a fuse 15 that will probably be broken when the electrolytic capacitor 6 gets out of order are also mounted on the primary side replaceable printed circuit board 9. Engaging projections 26, 27 are formed on the primary side replaceable frame 21, whereas corresponding respective engaging recesses 28, 29 are formed on the main body frame 19. The primary side replaceable printed circuit board 9 is arranged in such a way that the connector 12 of the primary side replaceable printed circuit board 9 and the connector 13 of the reusable printed circuit board 7 are electrically reliably connected to each other when the engaging projections 26, 27 of the primary side replaceable frame 21 and the corresponding respective engaging recesses 28, 29 of the main body frame 19 are brought into mutual mechanical engagement.

When the electrolytic capacitors 5, 6 go out of service life and have to be replaced, firstly the secondary side replaceable frame 20 and the primary side replaceable frame 21 are moved away from the main body frame 19 by releasing the engaging projections 22, 23, 26, 27 and the corresponding respective engaging recesses 24, 25, 28, 29 from mutual engagement. Then, a new secondary side replaceable frame 20 and a new primary side replaceable frame 21 that are prepared in advance are fitted to the main body frame 19 by bringing the engaging projections 22, 23, 26, 27 and the corresponding respective engaging recesses 24, 25, 28, 29 into mutual engagement.

With the above described arrangement, the electrolytic capacitors 5, 6 can be replaced with easy in the switching power supply unit 100. The strength of each of the replaceable parts can be raised because the electrolytic capacitors 5, 6 can be replaced simply by replacing the secondary side replaceable frame 20 and the primary side replaceable frame 21. Therefore, the switching power supply unit can be handled in an easy, safe and reliably manner and the user can replace the replaceable printed circuit boards.

Additionally, not only the electrolytic capacitors but also the electronic parts having a service life substantially same as that of the electrolytic capacitors such as the photocoupler 14 and the fuse 15 that can get out of order with the electrolytic capacitors may be mounted on the replaceable printed circuit boards.

(Second Embodiment)

Figure 4A:
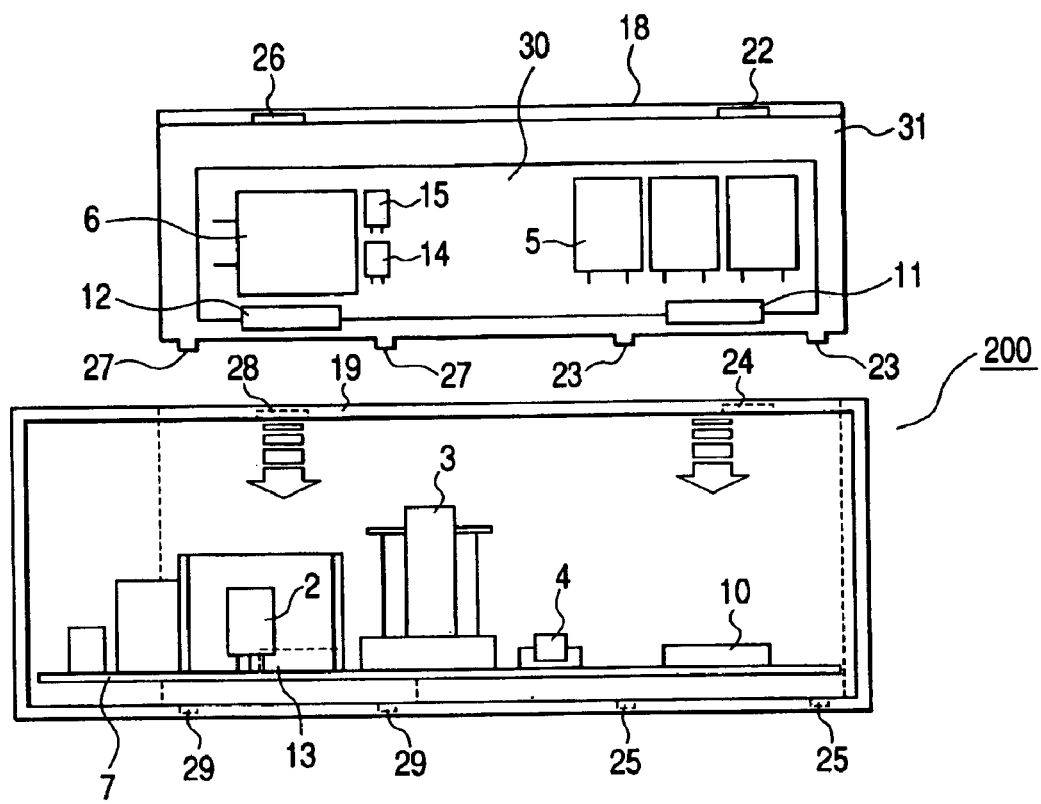
FIG. 4A is a schematic cross sectional view of the second embodiment of switching power supply unit according to the invention.
Figure 4B:
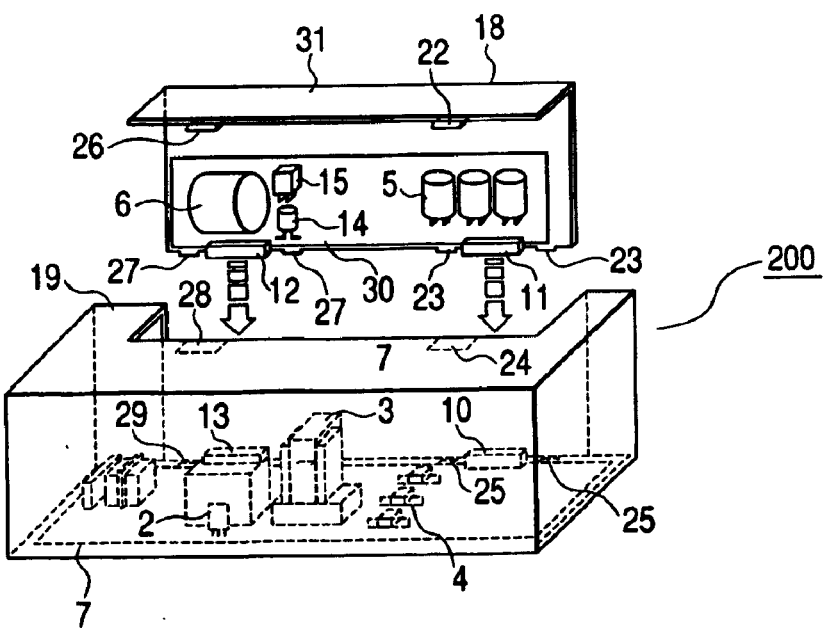
FIG. 4B is a schematic perspective view of the second embodiment of switching power supply unit according to the invention.

Now, the second embodiment of the invention will be described below by referring to FIGS. 4A and 4B. FIG. 4A is a schematic cross sectional view of the second embodiment of switching power supply unit 200 and FIG. 4B is a schematic perspective view of the second embodiment of switching power supply unit 200. Note that the replaceable parts are exploded in FIGS. 4A and 4B for the purpose of easy understanding. The inside of the switching power supply unit 200 is made partly visible. In FIGS. 4A and 4B, the components that are same as those of FIGS. 3A and 3B are denoted respectively by the same reference symbols and will not be described any further.

The embodiment of FIGS. 4A and 4B differs from that of FIGS. 3A and 3B in that the secondary side replaceable printed circuit board 8 and the primary side replaceable printed circuit board 9 of the first embodiment are put together and formed as a single replaceable printed circuit board 30 in the second embodiment. All of the secondary side electrolytic capacitors 5, the primary side electrolytic capacitor 6, the photocoupler 14 and the fuse 15 are mounted on the replaceable printed circuit board 30. Since the electrolytic capacitors have a substantially same service life, the secondary side electrolytic capacitors 5 and the primary side electrolytic capacitor 6 are preferably replaced at the same time. From this point of view, the second embodiment is so designed that the secondary side electrolytic capacitors 5 and the primary side electrolytic capacitor 6 can be replaced in an easy, safe and reliably manner.

The replaceable printed circuit board 30 is fitted to a replaceable frame 31. As in the case of the secondary side replaceable frame 20 and the primary side replaceable frame 21, engaging projections 22, 23, 26, 27 are formed on the replaceable frame 31, whereas corresponding respective engaging recesses 24, 25, 28, 29 are formed on the main body frame 19. The connectors 10, 11 and the connectors 12, 13 are mechanically linked to each other and the replaceable printed circuit board 30 and the reusable printed circuit board 7 are electrically connected to each other when the engaging projections 22, 23, 26, 27 and the corresponding respective engaging recesses 24, 25, 28, 29 are brought into mutual engagement.

This embodiment has to be so designed in advance that the secondary side electrolytic capacitors 5 and the primary side electrolytic capacitor 6 can be arranged along the same lateral side of the switching power supply unit 200 because they are mounted on the same replaceable printed circuit board 30.

Additionally, since the primary side and the secondary side of a power supply circuit normally need to be insulated from each other, the secondary side electrolytic capacitors 5 and the primary side electrolytic capacitor 6 have to be mounted with a sufficient distance separating them from each other when they are mounted on the same replaceable printed circuit board 30.

With the above described arrangement, the electrolytic capacitors 5, 6 can be replaced simply by replacing the replaceable frame 31 of the switching power supply unit. Therefore, this embodiment can be handled more easily than the first embodiment and hence the user can easily replace the replaceable printed circuit board.

As described above in detail, according to the invention, replaceable parts having a relatively short service life such as electrolytic capacitors are mounted on a reusable printed circuit board and one or more than one replaceable printed circuit boards so that the operation of replacing the electrolytic capacitors can be performed very easily and reliably. Then, as a result, the labor cost, the number of steps and the time period that have to be spent for the operation of replacing the electronic parts can be remarkably reduced.

The operation of replacing the electrolytic capacitors can be performed more easily and reliably when the replaceable printed circuit board is fitted to a replaceable frame and the replaceable frame is replaced. Then, the user can easily replace the electrolytic capacitors.

The operation of replacing the electrolytic capacitors can be performed more easily and reliably when the primary side replaceable parts and the secondary side replaceable parts are mounted on the same replaceable printed circuit board.

What is claimed is:

1. A switching power supply unit comprising:
   a reusable printed circuit board carrying reusable electronic parts;
   a main body frame carrying said reusable printed circuit board;
   a replaceable printed circuit board carrying replaceable electronic parts and formed so as to be removably fitted to said reusable printed circuit board; and
   a replaceable frame carrying said replaceable printed circuit board;
   the replaceable printed circuit board being electrically and mechanically connected to the reusable printed circuit board and adapted to be replaced by removing said replaceable frame.

2. The switching power supply unit according to claim 1, wherein:
   said replaceable printed circuit board being adapted to be replaced with another replaceable printed circuit board carried by another replaceable frame previously prepared.

3. The switching power supply unit according to claim 1, wherein
   said reusable printed circuit board and said replaceable printed circuit board are provided with respective connectors in such a way that said reusable printed circuit board and said replaceable printed circuit board are electrically connected by connecting the connectors.

4. The switching power supply unit according to claim 1, wherein the replaceable printed circuit boards are provided respectively at the primary side and at the secondary side of the unit.

5. The switching power supply unit according to claim 1, wherein the replaceable electronic parts provided at the primary side and those provided at the secondary side of the unit are mounted on the same replaceable printed circuit board.

6. The switching power supply unit according to claim 5, wherein the replaceable electronic parts provided at the primary side and the replaceable electronic parts provided at the secondary side as mounted on the same replaceable printed circuit board are arranged with a predetermined gap interposed between them.

7. The switching power supply unit according to claim 5, wherein the replaceable electronic parts provided at the primary side and the replaceable electronic parts provided at the secondary side are arranged along a lateral side of the switching power supply unit.

8. The switching power supply unit according to claim 1, wherein said replaceable electronic parts include at least an electrolytic capacitor.

9. The switching power supply unit according to claim 8, wherein said replaceable electronic parts further include a photocoupler and a fuse.

* * * * *